(12) United States Patent
Mallinson

(10) Patent No.: US 8,766,841 B2
(45) Date of Patent: Jul. 1, 2014

(54) IMPEDANCE NETWORK FOR PRODUCING A WEIGHTED SUM OF INPUTS

(75) Inventor: Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 59 days.

(21) Appl. No.: 13/515,254

(22) PCT Filed: Dec. 11, 2009

(86) PCT No.: PCT/CA2009/001818
§ 371 (c)(1),
(2), (4) Date: Oct. 4, 2012

(87) PCT Pub. No.: WO2011/069230
PCT Pub. Date: Jun. 16, 2011

(65) Prior Publication Data
US 2013/0015995 A1    Jan. 17, 2013

(51) Int. Cl.
*H03M 1/78* (2006.01)
*H03M 1/80* (2006.01)

(52) U.S. Cl.
CPC ............... *H03M 1/78* (2013.01); *H03M 1/785* (2013.01)
USPC ............................ 341/153; 341/155; 341/154

(58) Field of Classification Search
CPC ....................................................... H03M 1/78
USPC .................................. 341/153, 154, 155, 144
See application file for complete search history.

(56) References Cited

U.S. PATENT DOCUMENTS

| | | | |
|---|---|---|---|
| 4,636,772 A | 1/1987 | Yasunaga | |
| 5,059,978 A * | 10/1991 | Valdenaire | 341/145 |
| 6,414,616 B1 * | 7/2002 | Dempsey | 341/144 |
| 6,567,026 B1 * | 5/2003 | Gorman | 341/154 |
| 6,937,178 B1 * | 8/2005 | Rempfer et al. | 341/154 |
| 2007/0194965 A1 * | 8/2007 | Kim et al. | 341/144 |
| 2009/0160690 A1 | 6/2009 | Kawaguchi et al. | |

OTHER PUBLICATIONS

International Search Report of PCT/CA09/001818 dated Feb. 23, 2010 pp. 1-3.
Written Opinion of PCT/CA09/001818 dated Feb. 23, 2010 pp. 1-6.

* cited by examiner

*Primary Examiner* — Jean B Jeanglaude
(74) *Attorney, Agent, or Firm* — LaRiviere, Grubman & Payne, LLP

(57) ABSTRACT

A dynamically selectable resistor network is provided in a star configuration for producing a weighted sum of input values, without attenuation from near zero contributions. Each branch of the star connected network comprises sets of impedance components, preferably resistors, that are actively selectable to produce permutated combinations of effective weighting values. The resistors code digital control bits and the outputs of sets of resistors in respective branches that correspond to the least significant control bits provide their outputs to the summing output node independently of the sets of resistors corresponding to control bits of other significance.

16 Claims, 3 Drawing Sheets

IMPEDANCE NETWORK FOR PRODUCING A WEIGHTED SUM OF INPUTS

CROSS-REFERENCE TO RELATED APPLICATIONS

This application is a 35 USC §371 application of International Application No. PCT/CA2009/001818 filed Dec. 11, 2009, which is hereby incorporated by reference in its entirety.

FIELD OF THE INVENTION

This invention relates to the digital to analog conversions. In particular this invention relates to an impedance selection network for producing a weighted sum of input values useful in Digital to Analog Converter and signal processing applications.

BACKGROUND OF THE INVENTION

Voltages or currents may be manipulated in resistor networks under digital control if switches are used to vary the connectivity of the resistors. When configured with digital control, the network can be considered a DAC (Digital to Analog Converter) since it commonly results in an analog output parameter proportional to the digital number applied, or sometimes a Multiplying DAC (MDAC) in cases where a conversion scale factor is involved.

Certain classes of such networks of resistors and switches are known to contain the fewest number of elements, and the smallest dynamic range of values. One member of this optimum class is the commonly used R-2R network. There are two distinct ways that R-2R networks can be connected to make a DAC: the so called "voltage mode DAC" and "current mode DAC". Each has its advantages and disadvantages, discussed in the paper by Walt Kester, available online at http://www.analog.com/static/imported-files/tutorials/MT-015.pdf.

Of interest in the present case is the ability of multiple MDAC's to form a sum-of-products as is often required in signal processing and other applications. Since a voltage mode MDAC has constant output impedance, multiples MDACs may be connected to a common output node and the sum-of-products will appear as the voltage on that output node. However such sum-of-products configurations have limitations.

In a sum-of-products using voltage mode R-2R MDACs, the expression for the output is:

$$Y = \frac{1}{N} \cdot \sum_{i=0}^{N-1} X_i \cdot D_i$$

where X is the analog input voltage, D the digital number applied and N the total number of MDACs used.

While such an approach is practical for some applications, the presence of zero or near-zero values in the D variable can significantly attenuate the output signal. This arises because the addition of each MDAC with $D_i=0$ will have no effect on the summation ($X_i*D_i=0$), but it will reduce the output signal since the addition of an MDAC has increased N to N+1 and the output signal is a function of 1/N. For example, if the Di are {0.8, 0.5, 0.7, 0.6, 0.9, 0.7, 0.8, 0.6, 0.7, 0.8} and all Xi are equal to one, the output will be 0.71. However if Di are {0.08, 0.05, 0.07, 0.06, 0.9, 0.07, 0.08, 0.06, 0.07, 0.08}, i.e. each being scaled down by 10 except the 0.9 near the middle, then we have not 0.71 but only 0.152. Clearly, as more elements with values near to zero are added there is an increased attenuation in the output signal.

This limits the applicability of the voltage mode R-2R MDAC to those sum-of-product applications that do not have many near zero-values. Unfortunately, one of the more interesting sum-of-products applications is the finite impulse response filter (FIR) in which the coefficients are almost all near zero. This limits the usefulness of the R-2R MDAC implementation despite the attraction it has of a small number of resistor values.

There is therefore a need for a device capable of producing a weighted sum of input values that does not suffer from an increased attenuation when there are many near zero coefficients, but that operates with a limited dynamic range of resistor or impedance values.

These and other objects of the invention will be better understood by reference to the detailed description of the preferred embodiment which follows. Note that not all of the objects are necessarily met by all embodiments of the invention described below or by the invention defined by each of the claims.

SUMMARY OF THE INVENTION

The invention comprises a digitally controllable impedance network that produces a weighted sum of products.

The invention draws inspiration from a recognition that the voltage at the node of star-connected resistor networks is tolerant of near zero value inputs applied to one or more of the branches, and that the branch resistors provide a weighting factor of 1/R of the branch input to the node output. Resistor dynamic range is further controlled by a novel branch and summing configuration.

According to one aspect, the invention comprises a dynamically controllable switched impedance network comprising a plurality of branches of impedance components, the branches being connected in a star configuration to a summing output node.

In another aspect of the invention, each of the branches comprises at least one set of impedance components selectable by at least one active device in permutated combinations to achieve one of several possible impedance values for the set. In a more particular aspect of the invention, the set of impedance components are selectable to result in a parallel arrangement of all of the impedance components in the set.

In a further aspect of the invention, each of the branches comprises a plurality of sets of such selectable impedance components.

In yet a further aspect of the invention, the dynamically controllable network is digitally controllable, and the number of impedance components in each branch corresponds to the number of elements in a digital control signal.

In one aspect, the invention comprises such a network in which specific sets from a given branch are used to code sets of control bits of a given significance.

In another aspect of the invention, the respective sets from each branch that are used to code control bits of a given significance provide their outputs to the summing output node independently of the outputs of the other sets in their branch.

In another aspect of the invention, each set comprises successive impedance values that are multiples of the preceding impedance value.

In yet another aspect of the invention, an impedance component is provided between the summing output node and the output of each sets other than the sets used to code the most significant bits in the control signal.

In another aspect of the invention, each of the foregoing networks is used in a rotating coefficient signal processor for summing weighted values of a signal across a set of coefficients. In a more particular aspect, the networks are used in a rotating coefficient FIR filter.

In a method aspect, the invention comprises a method of producing a weighted sum of input values, comprising providing a network of resistors grouped in sets and in branches of sets, the branches being connected in a star configuration to a common summing output node, under digital control selecting combinations of resistors in each set to apply an effective weighting value to each set, providing inputs to each of the branches and providing a summed output of the branches at the summing output node.

In another aspect of the invention, the sets within a branch correspond to the significance of bits in control signals applied to respective sets.

In yet a further aspect, the method further comprises attenuating the contribution of the sets representing all but the most significant bits by applying an impedance between the output of such sets and the summing output node.

The foregoing was intended as a broad summary only and of only some of the aspects of the invention. It was not intended to define the limits or requirements of the invention. Other aspects of the invention will be appreciated by reference to the detailed description of the preferred embodiment and to the claims.

BRIEF DESCRIPTION OF THE DRAWINGS

The invention will be described by reference to the detailed description of the preferred embodiment and to the drawings thereof in which.

DETAILED DESCRIPTION OF THE PREFERRED EMBODIMENT

Figure 1:
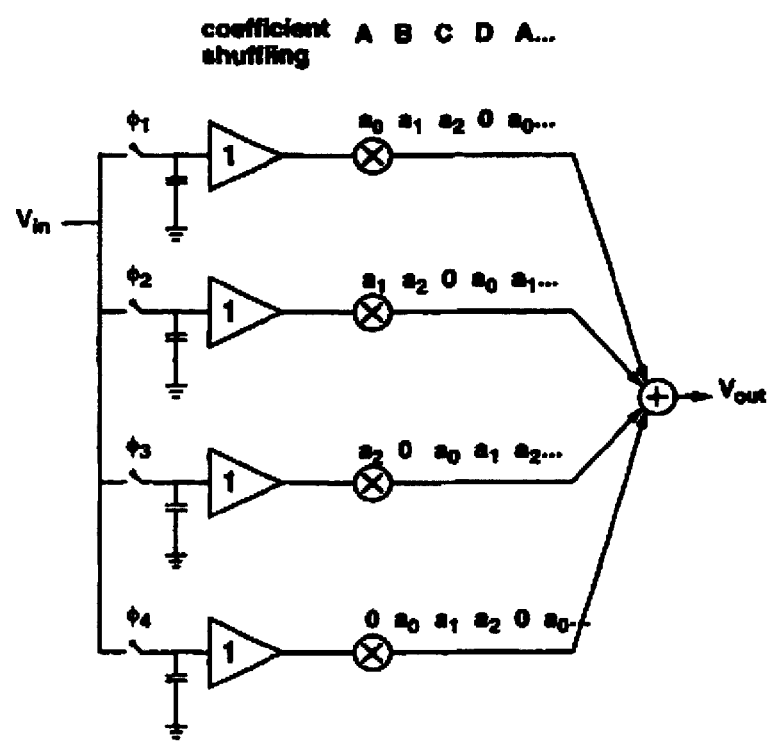
FIG. 1 is a diagram of a prior art rotating coefficient FIR filter.

The voltage present at the node in the center of a "star-connected" network is:

$$Y = \frac{1}{\sum_{i=0}^{N-1} \frac{1}{R_i}} \cdot \sum_{i=0}^{N-1} \frac{V_i}{R_i}$$

If it is assumed that $R_{parallel}$ represents the equivalent parallel impedance of all the resistors (the first term prior to the second summation is just the parallel operation), the equation resolves itself to:

$$Y = R_{parallel} \cdot \sum_{i=0}^{N-1} \frac{V_i}{R_i}$$

It follows that the star connected network can be seen to provide the weighted sum of the input voltages where the weight is 1/R. The addition of another branch to the network with a desired weighting of the new Vi close to zero requires a large R to be present. A large R has little impact upon the $R_{parallel}$ term, since a large value in parallel with a smaller resistor does not significantly change the parallel combination value.

Such an arrangement appears to provide the means to construct a sum-of-products network that can handle many near zero terms with no significant attenuation and hence less noise. In fact the total gain is always fixed independent of the value of the Ri. For example, using the weights as used above in the voltage mode R-2R example, namely weights {0.8, 0.5, 0.7, 0.6, 0.9, 0.7, 0.8, 0.6, 0.7, 0.8} and where all Xi are equal to one, it is seen that R0=1/0.8, R1=1/0.5, R2=1/0.7 etc. Since the Vi are assumed to be all unity:

$$R_{parallel} = 0.1408 \text{ and } \sum_{i=0}^{N-1} \frac{V_i}{R_i} = 7.1 \Rightarrow Y = 1$$

Adjusting the weights to {0.08, 0.05, 0.07, 0.06, 0.9, 0.07, 0.08, 0.06, 0.07, 0.08} yields:

$$R_{parallel} = 0.6579 \text{ and } \sum_{i=0}^{N-1} \frac{V_i}{R_i} = 1.52 \Rightarrow Y = 1$$

As can be seen, there is no change in the gain to the output Y: the scaling factor remains the same.

This suggests that some form of star-connected network might be useful in providing a weighted sum of inputs. However, in order to accommodate different weighting values, it will be desirable to be able to dynamically adjust the value of 1/R. In a simple implementation, a resistor R would be connected between two nodes via an active device such as a switch such that when the switch is 'on', R appears between the nodes. In a binary digital control context, a resistor of value 2R is similarly connected (typically in parallel), as well as resistors of values 4R, 8R and so forth. Since they are connected in parallel, the conductances add, providing control of the total conductance (1/R) as required using permutated combinations of the various resistors.

However that simple approach entails an inconvenience. If, for example, 9 bit control is needed, the dynamic range of R values that will be required will be high: the MSB (Most Significant Bit) will connect the 'R', and the LSB (Least Significant Bit) will have to connect '256R'. The advantage of the prior art R-2R solution, namely that it only ever needs resistors in the ratio two to one, appears to have been lost. In fact, the contemplated approach appears to require resistors in the ratio of at least 250:1 to make even a modest 9 bit tap value for weight coefficient adjustments. A solution to the problem is developed below in the preferred embodiment context of a rotating coefficient FIR filter.

A rotating coefficient FIR filter is represented in FIG. 1, drawn from FIG. 7 of a 1999 thesis by Cameron Lacy entitled "Design of a Switched Capacitor Analog FIR Filter" from the National Library of Canada. The coefficients rotate in order to be applied to the samples that are taken in a "round-robin" fashion.

The star-connected network of the present invention may be used to provide the rotating coefficients in each branch of the filter, and the summing junction of the filter, provided an appropriate means of changing the coefficients in a relatively simple resistor network can be achieved.

Figure 2:
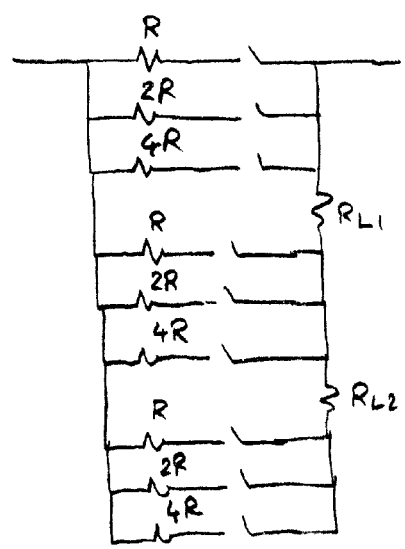
FIG. 2 is a circuit schematic of a prototype resistor selection network used in the development of the eventual preferred embodiment; and, FIG. 3 is a circuit schematic showing the preferred embodiment of the invention.

In order to reduce the dynamic range required of the resistor values in the star connected resistor network of the invention, the prototype shown in FIG. 2 will first be considered. FIG. 2 represents a form of segmented processor. Each of the three R/2R/4R resistors provides a three bit operation, but to make effectively nine bits, "link resistors" RL1 and RL2 would be used to attenuate the contribution of the sets of LSB's (the top switch being the MSB and the bottom switch being the LSB). The several resistors in each set are arranged in pseudo-parallel arrangement, i.e. if all three switches of a set were selected to be closed, the resistors would be in parallel. Unfortunately this configuration is impractical because the impedance of the output of the middle three and bottom three bits is not constant: no matter what the value of the resistors RL1 and RL2, the operation of the network will be non-linear—and hence of little value—due to the changing output impedances of the segments.

Figure 3:
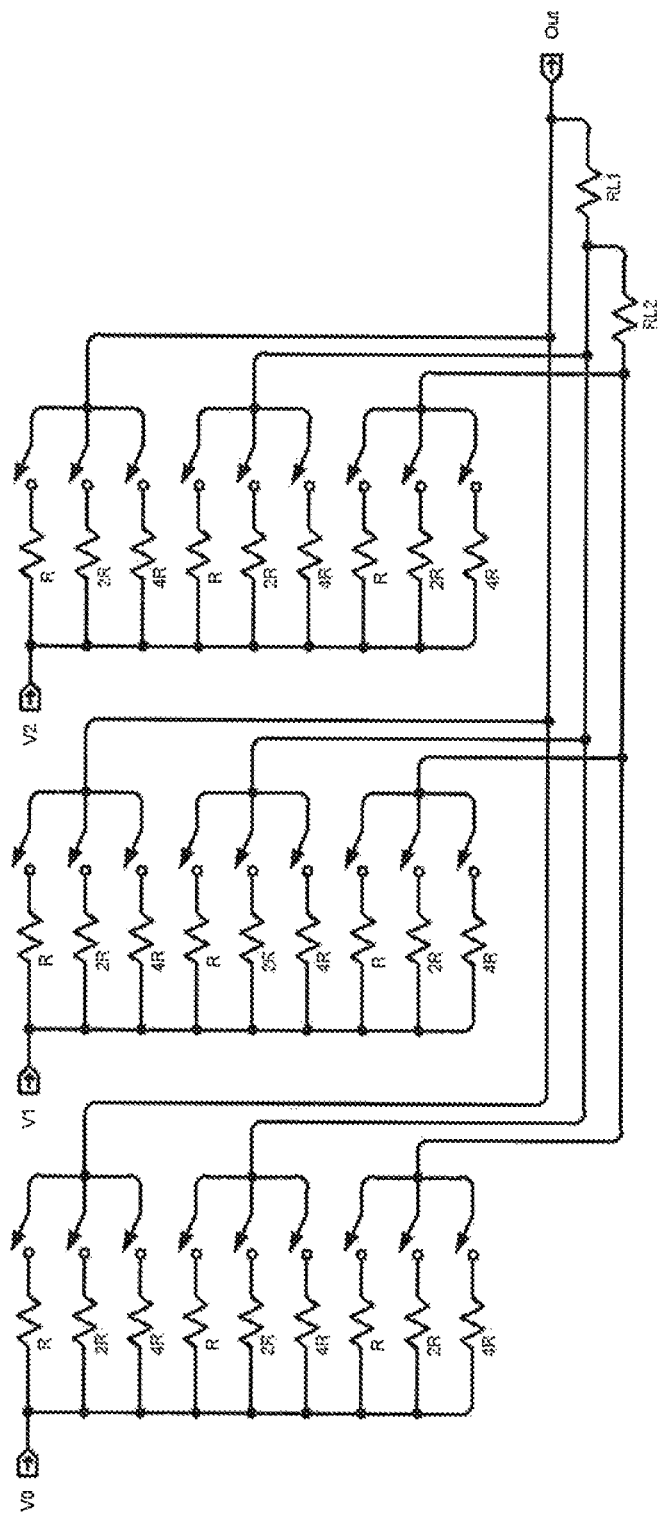

That problem is solved by the configuration shown in the preferred embodiment of FIG. 3. As in the case of FIG. 2, each branch comprises a plurality of sets of resistors selectable by an active device such as a switch. However, the preferred embodiment avoids linking the sets through RL1 and RL2 on a branch by branch (that is tap by tap) basis. That is done by postponing the use of the link resistors to the top level. In effect, the respective sets from each branch that are used to code control bits of a given significance provide their outputs to the summing output node "OUT" independently of the outputs from the other sets in their branch. For example the sets of three most significant bits in each of the three branches of FIG. 3 sum their outputs at the summing output node without contribution from the other sets of those branches, save for the effect of the overall star-connected topology.

FIG. 3 shows three taps of the rotating coefficient FIR filter, with the MSB being at the top of each column and the LSB at the bottom. Each branch is segmented into three three-bit sections and the maximum dynamic range of resistor values is 4:1. The sets are arranged in groups to code control bits of a given significance. For example, the sets of three uppermost bits in each branch of FIG. 3 code for the 3 most significant control bits. The link resistors RL1 and RL2 are not repeated in each individual branch—they are used only one time to merge each of the segments after they are summed—into the final output. RL1 and RL2 are provided between the summing output node "OUT" and the output of each set other than the set of three most significant bits in the control signal. This works because the impedance seen at the link resistor point is constant: each individual branch has varying output impedance, but the collection of branches has constant output impedance, hence one fixed value of RL1 (and RL2) works. The impedance must be constant, because the same coefficients are rotating around and the branches are indistinguishable.

It will be appreciated that the "star connected" adjustable resistor network as disclosed has the advantage that when multiple branches are wired together at the output forming a sum-of-products network, there is no attenuation in the output even if many "near zero" coefficients are present in the control code. To avoid the need for a large dynamic range of resistor values, the invention segments the branches, in a viable implementation of a rotating coefficient FIR filter. In general, a sufficient requirement for segmentation is that the total output impedance of each segment be constant.

The preferred embodiment has been described in the context of a star-connected resistor network. It will be appreciated that the principles of the invention are applicable to the more generalized case of a star-connected impedance network.

It will be appreciated by those skilled in the art that the preferred and alternative embodiments have been described in some detail but that certain modifications, including without limitation providing for equivalent components or component values, may be practiced without departing from the principles of the invention.

It is claimed:

1. A dynamically controllable switched impedance network comprising a plurality of branches of impedance components, the branches being connected in a star configuration to a summing output node and wherein each of said branches comprises at least one set of impedance components selectable by a plurality of active devices in permutated combinations of said active devices and components to achieve one of several possible impedance values for said set.

2. The network of claim 1 wherein each of said branches comprises a plurality of sets of such selectable impedance components.

3. The network of claim 1 wherein said set of impedance components are selectable to result in a parallel arrangement of all of the impedance components of the set.

4. The network of claim 3 wherein each set of components comprises successive impedance values that are multiples of the preceding impedance value.

5. The network of claim 2 wherein said network is digitally controllable, and the number of impedance components in each branch corresponds to the number of elements in a digital control signal.

6. The network of claim 5 wherein specific sets from a given branch are used to code sets of control bits of a given significance.

7. The network of claim 6 wherein the respective sets from each branch that are used to code control bits of a given significance provide their outputs to the summing output node independently of the outputs of the other sets in their branch.

8. The network of claim 7 wherein an impedance component is provided between said summing output node and the output of each sets other than the sets used to code the most significant bits in the control signal.

9. The network of claim 1, configured to sum weighted values of a signal across a set of coefficients.

10. The network of claim 9, wherein the set of the coefficients are from a rotating coefficient FIR filter.

11. A method of producing a weighted sum of input values, comprising:
    providing a network of resistors grouped in sets and in branches of sets, said branches being connected in a star configuration to a common summing output node;
    under digital control selecting permutated-combinations of resistors in
    each set to apply an effective weighting value to each set;
    providing inputs to each of the branches; and,
    providing a summed output of the branches at said summing output node.

12. The method of claim 11 wherein the sets within a brunch correspond to the significance of bits in control signals applied to respective sets.

13. The method of claim 12 further comprising:
    attenuating the contribution of the sets representing all but the most significant bits by applying an impedance between the output of such sets and the summing output node.

14. A dynamically digitally controllable switched impedance network comprising a plurality of branches of impedance components, the branches being connected in a star configuration to a summing output node, each branch comprising a plurality of sets of selectable impedance components, the number of impedance components in each branch corresponding to the number of elements in a digital control signal and wherein specific sets from a given branch are used to code sets of control bits of a given significance.

15. The network of claim 14 wherein the respective sets from each branch that are used to code control bits of a given significance provide their outputs to the summing output node independently of the outputs of the other sets in their branch.

16. The network of claim 15 wherein an impedance component is provided between said summing output node and the output of each sets other than the sets used to code the most significant bits in the control signal.

* * * * *

UNITED STATES PATENT AND TRADEMARK OFFICE
CERTIFICATE OF CORRECTION

| | |
|---|---|
| PATENT NO. | : 8,766,841 B2 |
| APPLICATION NO. | : 13/515254 |
| DATED | : July 1, 2014 |
| INVENTOR(S) | : Martin Mallinson |

It is certified that error appears in the above-identified patent and that said Letters Patent is hereby corrected as shown below:

In the Claims:
Claim 12, column 6, line 61, delete "brunch" and insert --branch--.

Signed and Sealed this
Thirtieth Day of September, 2014

Michelle K. Lee
*Deputy Director of the United States Patent and Trademark Office*